(12) United States Patent
Hosono et al.

(10) Patent No.: US 6,278,639 B1
(45) Date of Patent: Aug. 21, 2001

(54) BOOSTER CIRCUIT HAVING BOOSTER CELL SECTIONS CONNECTED IN PARALLEL, VOLTAGE GENERATING CIRCUIT AND SEMICONDUCTOR MEMORY WHICH USE SUCH BOOSTER CIRCUIT

(75) Inventors: Koji Hosono, Yokohama; Hiroshi Nakamura, Kawasaki; Tamio Ikehashi, Kamakura; Kazushige Kanda, Kawasaki; Ken Takeuchi, Tokyo; Kenichi Imamiya, Kawasaki, all of (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/392,127

(22) Filed: Sep. 8, 1999

(30) Foreign Application Priority Data

Sep. 8, 1998 (JP) .................................. 10-254218
Jun. 30, 1999 (JP) .................................. 11-187021

(51) Int. Cl.[7] ...................................... G11C 7/00
(52) U.S. Cl. .............................. 365/189.09; 365/189.11; 365/185.23

(58) Field of Search .................. 365/189.09, 189.11, 365/185.23, 226; 327/534, 536, 537

(56) References Cited

U.S. PATENT DOCUMENTS

| | | | |
|---|---|---|---|
| 5,644,534 | * 7/1997 | Soejima | 365/185.23 |
| 5,815,446 | * 9/1998 | Tobita | 365/189.09 |
| 5,841,703 | * 11/1998 | Wojciechowski | 365/189.09 |
| 5,978,283 | * 11/1999 | Hsu et al. | 365/189.09 |

FOREIGN PATENT DOCUMENTS

| | | |
|---|---|---|
| 7111095 | 4/1995 | (JP) . |
| 7201174 | 7/1995 | (JP) . |
| 10050088 | 2/1998 | (JP) . |

* cited by examiner

*Primary Examiner*—Vu A. Le
(74) *Attorney, Agent, or Firm*—Hogan & Hartson, LLP

(57) ABSTRACT

The booster circuit of the present invention includes a first booster cell section in which one or more booster cells are connected in series, and a second booster cell section having an end which is connected to the first booster cell section, in which a plurality of booster cell groups each containing one or more booster cells connected in series, are connected to each other in parallel.

14 Claims, 10 Drawing Sheets

$V_{ref} > V'_{ref}$

BOOSTER CIRCUIT HAVING BOOSTER CELL SECTIONS CONNECTED IN PARALLEL, VOLTAGE GENERATING CIRCUIT AND SEMICONDUCTOR MEMORY WHICH USE SUCH BOOSTER CIRCUIT

BACKGROUND OF THE INVENTION

The present invention relates to a booster circuit having booster cell sections connected in series, which is designed to increase the power voltage, and a voltage generating circuit and a semiconductor memory which use such a booster circuit.

In semiconductor integrated circuits which are equipped with electrically writable/erasable non-volatile memories such as EEPROMs and flash memories, such a high voltage that is required for writing or erasing is generated within a chip by an internal voltage generating circuit, so as to meet the requirement of unifying the power source.

An internal voltage generating circuit consists of a booster circuit for boosting a power voltage supplied from outside, a voltage limiter for adjusting an output voltage of the booster circuit, to a desired voltage value (internal voltage), and a clock generating circuit for controlling the operation of the booster circuit.

FIG. 15 is a circuit diagram equivalent to a conventional internal voltage generating circuit. It should be noted that the circuit shown here is of a type which operates by two-phase clock. In FIG. 15, booster cells $CP_x$ ($CP_1$ to $CP_m$) connected in multiple stages, to each of which a potential is supplied from the power, constitute a booster circuit 10. Further, a $V_{XX}$ limiter circuit 30 is connected to an output node 11 of the booster circuit which outputs an output voltage $V_{XX}$.

The $V_{XX}$ limiter circuit 30 monitors the voltage at the output node 11 when an activation signal ACTIVE is at "H" level (/ACTIVE is at "L" level), and further outputs a voltage detection signal $V_{XX}$FLG to a clock generating circuit 20.

While the activation signal ACTIVE is at "H" level (/ACTIVE is at "L" level) and the voltage detection signal $V_{XX}$FLG is at "L" level, the clock generating circuit 20 outputs a booster clock signal $\Phi_A$ or $/\Phi_A$ by using a clock signal CLK having a predetermined period, and thus the booster circuit 10 carries out a boost operation.

The booster circuit 10 consists of booster cells $CP_x$ ($CP_1$ to $CP_m$) connected in series in multiple stages, to which clock signal $\Phi_A$ or $/\Phi_A$ is input from the clock generating circuit 20 alternately to every other stage.

For example, the limiter circuit 30 has a structure equivalent to the circuit shown in FIG. 16. The limiter circuit of FIG. 16 consists of a resistance element RL connected to the output node 11 shown in FIG. 15, an equivalent resistance R1 of a trimming circuit connected to a connection node N4 which is located on the other side to the output node 1, a transistor M3 connected between the equivalent resistance R1 and a ground potential, to a gate of which an activation signal ACTIVE is input, a potential comparator circuit 31 for detecting an output voltage $V_{XX}$ by comparing the potential at the connection node N4 and the reference potential $V_{ref}$, and for detecting a voltage detection signal $V_{XX}$FLG, and a buffer 33 connected to the potential comparator circuit 31 via a connection node 32, for the voltage detection signal $V_{XX}$FLG.

The limiter circuit 30 is in a non-active state when the activation signal ACTIVE is at "L" level, and the voltage detection signal $V_{XX}$FLG is at "L" level at all times. When the activation signal ACTIVE is at "H" level, the limiter circuit 30 is set in an active state. Further, when the potential at the connection node N4 is lower than the reference potential $V_{ref}$, the voltage detection signal $V_{XX}$FLG is at "L" level, whereas the potential of the connection node N4 is higher than the reference potential $V_{ref}$, the voltage detection signal $V_{XX}$FLG is at "H" level. The ratio between RL and R1 is determined so that a voltage $V_{XX}$ at the output node 11 becomes to have a desired voltage value, when the connection node N4 and the reference potential $V_{ref}$ are equal to each other.

Let us now consider a case where an output voltage $V_{XX}$ of an internal voltage generating circuit containing the booster circuit, is used for writing data in a flash memory or an EEPROM cell. Further, let us take an example of a NAND-type EEPROM in which writing of data is performed by injecting electrons to the floating gate from the channel while applying a high voltage (up to 20V) to the word line (control gate) and applying a substrate potential $V_{SS}$ (0V) to a cell. In this case, from the coupling ratio between the voltage applied to the word line and that the voltage applied to the floating gate of the cell, the writing characteristics by the FN tunnel injection are determined. In the NAND-type EEPROM, the writing voltage is, in some cases, stepped up by a voltage of about 0.5V during a writing operation. In this case, such a high accuracy and stability are required in the voltage rise speed that corresponds to the writing time, and the writing voltage for each cell.

FIG. 17 shows a voltage waveform of an output voltage $V_{XX}$ in the conventional internal voltage generating circuit shown in FIG. 15. As the boosting is started from an initial voltage of the booster circuit and the output voltage $V_{XX}$ reaches a predetermined voltage, the voltage detection signal $V_{XX}$FLG from the limiter circuit 30 is set to "H" level at a time $t_2$, and the clock generating circuit 20 is placed in a non-active state, thus stopping the boosting operation of the booster circuit 10. The limiter circuit 30 detects an output voltage $V_{XX}$ by dividing the resistance, and therefore during the operation (while the activation signal ACTIVE is at "H" level), when a leak current flows from the output node 11 at all times, or there is some other current path which serves as a load connected to the node, the output voltage $V_{XX}$ gradually decreases. When the output voltage $V_{XX}$ becomes lower than a preset voltage, the voltage detection signal $V_{XX}$FLG is set to "L" level at a time t4. Thus, the clock generating circuit 20 again outputs a clock signal $\Phi_A$ or $/\Phi_A$, and therefore the booster circuit 10 re-starts the boosting operation. As the booster circuit 10 is set in an active/stop state in accordance with the output from the voltage detection signal $V_{XX}$FLG, the output voltage $V_{XX}$ is outputted.

However, the resistance $R_L$ of the limiter circuit 30 is set in an order of several hundred kilo to MΩ so as to reduce the leak current. Although it depends upon how the resistance element is formed, it is likely to have a very long pattern and a parasitic capacitance is easily created. Such a parasitic capacitance causes a CR delay, and therefore the voltage detection by the limiter circuit 30 is delayed. As a result, the output voltage $V_{XX}$ overshoots during a period between t1 and t2, whereas it undershoots during a period between t3 and t4, and thus a potential different of $\Delta V$ with respect to the preset voltage is created.

The waveform of such a voltage is determined by the capability of the booster circuit and the size of the leak current of the limiter circuit. The output current of the booster circuit is larger than the leak current of the limiter circuit. Therefore, it is effective to suppress the capability of the booster circuit in order to smallen the potential difference ΔV; however with this method, a rise time up to t1 is delayed. Reversely, if the capability of the booster circuit is enhanced so as to quicken the rise time, the potential difference ΔV further broadens.

In the case where the writing of data is carried out while stepping up the write voltage, it is preferable that each write voltage should be controlled to ΔV which is less than a difference between adjacent step-up voltages. However, due to the above-described reason, it is necessary with the conventional circuit structure that the voltage should be adjusted to an appropriate value where the rise time and voltage difference ΔV are balanced with each other.

As described above, in the conventional booster circuit, the rise characteristics of the boosted potential and the size of the overshoot (potential difference ΔV) after reaching the preset voltage have a trade-off relationship with respect to each other, and therefore it is difficult to suppress the shaking of the voltage at the predetermined voltage value.

Thus, the object of the invention is to provide a booster circuit, an internal voltage generating circuit or a semiconductor memory, which is capable of achieving the improvement of the rise characteristics of the boosted voltage and the stabilization at the preset voltage.

BRIEF SUMMARY OF THE INVENTION

According to the present invention, there is provided a booster circuit including a first booster cell section in which one or more booster cells are connected in series, and a second booster cell section having an end which is connected to the first booster cell section, in which a plurality of booster cell groups each containing one or more booster cells connected in series, are connected to each other in parallel.

The following are preferable embodiments of the booster circuit.

(a) When an output voltage from the output terminal of the second booster cell section is at a predetermined voltage or less, all the cell groups of the second booster cell section are in an active state, whereas when the output voltage is at the predetermined voltage or higher, some of the booster cell groups in the second booster cell section are in an active state.

(b) The total boosting capability of the booster cells in the first booster cell section is equal to a sum of the boosting capabilities of those booster cells which constitute the booster cell groups of the second booster cell section.

(c) The booster circuit which further includes: a first switch circuit having one end connected to the output terminal of the second booster cell section; a third booster cell section having one end connected to the first switch circuit, in which one or more booster cells are connected in series; and a second switch circuit connected to a connection point between the first switch circuit and second booster cell sections.

(c-1) As the first switch circuit is turned off and the second switch circuit is turned on, a voltage is output from the other end of the second switch circuit, and as the first switch circuit is turned on and the second switch circuit is turned off, a voltage is output from the other end of the third booster cell section.

(c-2) In the case where an voltage is output from the third booster cell section, the boosting operations of the first, second and third booster cell sections are controlled in batch.

According to the present invention, there is further provided a voltage generating circuit including: a booster circuit having a first booster cell section in which one or more booster cells are connected in series, and a second booster cell section having an end which is connected to the first booster cell section, in which a plurality of booster cell groups each containing one or more booster cells connected in series, are connected to each other in parallel; a voltage detection circuit for detecting an output voltage from the booster circuit; and a boost control circuit for controlling the boosting operation of the first booster cell section, and the boosting operations of the cell groups in the second booster cell section, on the basis of the results of the detection by the voltage detection circuit.

The following are preferable embodiments of the voltage generating circuit.

(a) The voltage generating circuit which further includes: a first switch circuit having one end connected to an output terminal of the second booster cell section, a third booster cell section having one end connected to the fist switch circuit, in which one or more booster cells are connected in series, and a second switch circuit connected to a connection point between the second booster cell section and the first switch circuit; a first voltage detection circuit for detecting an output voltage from the other end of the second switch circuit; a first boost control circuit for controlling the boosting operation of the first booster cell section, and the boosting operations of the cells in the second booster cell section, on the basis of the results of the detection by the first voltage detection circuit; a second voltage detection circuit for detecting an output voltage from the other end of the third booster cell section; and a second boost control circuit for controlling the first, second and third booster cell sections in batch, on the basis of the results of the detection by the second voltage detection circuit.

(a-1) As the first switch circuit is turned off and the second switch circuit is turned on, a voltage is output from the other end of the second switch circuit, and as the first switch circuit is turned on and the second switch circuit is turned off, a voltage is output from the other end of the third booster cell section.

(b) With regard to the two voltage generating circuits, one of the voltage detection circuit and the first voltage detection circuit detects a first voltage which is lower than the maximum boosted voltage of the booster circuit, and a second voltage which is lower than the first voltage; and the control circuit controls the boosting operations of the first booster cell section and a booster cell group in the second booster cell sections on the basis of the results of the detention of the first voltage, and the boosting operations of the other booster cell group in the second boost cell section on the basis of the results of the detection the second voltage.

According to the present invention, there is further provided a semiconductor memory including a booster circuit having a first booster cell section in which one or more booster cells are connected in series, and a second boost cell section having and end which is connected to an output terminal first booster cell section, in which a plurals of booster cell groups each containing one or more booster cells connected in series, are connected to each other in parallel; and a memory cell on which writing, reading and erasing data are carried out in accordance with the output voltage from the booster circuit.

The following are preferable embodiments of the semiconductor memory.

The semiconductor memory may further include a first switch circuit having an end which is connected to an output terminal the second booster cell section; a second switch circuit connected to a connection point between the output terminal of the second booster cell section and the first switch circuit; and a third booster cell section having one end connected to the first switch circuit, in which a plurality of booster cells are connected in series.

The semiconductor memory may further include a voltage detection circuit for detecting that the output voltage from the booster circuit reaches a predetermined voltage value; and a time setting circuit for setting a pulse width of a write or erase voltage pulse for a memory cell, after the voltage detection circuit detects that the output voltage from the booster circuit has reaches the predetermined voltage value.

With the above-described structures, the present invention exhibits the following operational effects.

That is, according to the present invention, the section of the booster circuit, which is from the middle note to the output terminal, is arranged in parallel, and the capability of the booster circuit is switched in accordance with the output potential, and thus the potential difference at the preset potential can be smallen without significantly deteriorating the rise characteristics. Further, the boosting circuit is arranged in parallel only partially, the increase in the pattern area can be suppressed.

Further, as the first and third booster cell sections are connected in series to both ends of the second booster cell section arranged in parallel, it becomes possible to jointly use booster circuits of different objects, and thus the pattern area can be reduced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will now be described with reference to accompanying drawings.

First Embodiment

Figure 1:
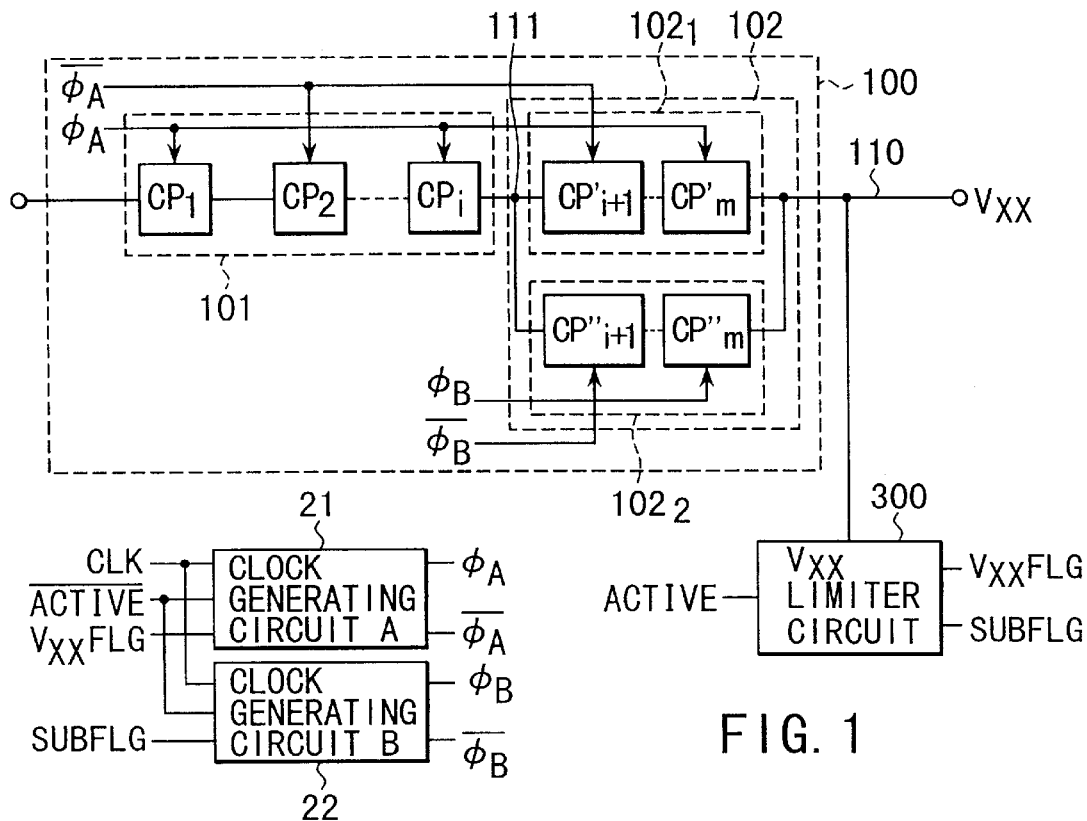
FIG. 1 is a circuit diagram equivalent to an internal voltage generating circuit including a booster circuit according to the first embodiment of the present invention.
Figure 2:
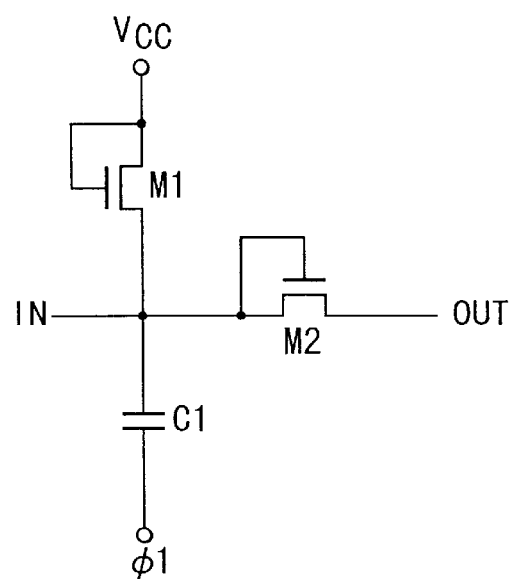
FIG. 2 is a circuit diagram equivalent to a booster cell which constitutes the booster circuit shown in FIG. 1.

FIG. 1 is a circuit diagram equivalent to an internal voltage generating circuit including a booster circuit according to the first embodiment of the present invention.

A $V_{XX}$ limiter circuit 300 is connected to an output node 110 of a booster circuit 100 to which a potential is supplied from the power. The $V_{XX}$ limiter circuit 300 receives an activation signal ACTIVE, and outputs a voltage detection signal $V_{XX}$FLG, which will be later described, to a clock generating circuit A21, and a voltage detection signal SUBFLG, which will be later described, to a clock generating circuit B22. Further, a clock signal CLK having a predetermined period and an activation signal /ACTIVE are input to the clock generating circuits A21 and B22. A clock signal $\Phi_A$ or /$\Phi_A$ is output from the clock generating circuit A21 to a first booster cell section 101 and first booster cell group 102$_1$, whereas a clock signal $\Phi_B$ or /$\Phi_B$ is output from the clock generating circuit B21 to a second booster cell group 102$_2$.

The structure of the booster circuit 100 will now be described in detail. The booster circuit 100 consists of a first booster cell section 101 and a second booster cell section 102 connected in series to the first booster cell section 101. The first booster cell section 101 consists of i number (i≧1) of booster cells $CP_1$ to $Cp_i$ connected in series in multiple stages. The second booster cell section 102 connected between an output node 111 of the first booster cell section 101 and an output node 110 of the booster circuit 100, consists of a first booster cell group 102$_1$ in which a (m−i) number (m−i≧1) of booster cells $CP'_{i+1}$ to $CP'_m$ are connected in series in multiple stages, and a second booster cell group 102$_2$ in which a (m−i) number (m−i≧1) of booster cells $CP''_{i+1}$ to $CP''_m$ are connected in series in multiple stages, which are connected in parallel.

It should be noted that the booster cells ($CP_1$ to $CP_n$, $CP'_{i+1}$ to $CP'_m$, and $CP''_{i+1}$ to $CP''_m$) which constitute the booster cell section 101 and the booster cell groups $102_1$ and $102_2$) are designed to be responsive to two-phase or four-phase clock signals. For example, a booster cell for two-phase clock consists of an NMOS transistor M1 diode-connected, to which a potential is supplied, and an NMOS transistor M2 diode-connected between a capacitor C1 connected to one end of the MOS transistor M1 and a booster cell of the subsequent stage.

To the booster cells $CP_1$ to $CP_n$ and $CP'_{i+1}$ to $CP'_m$, which are connected in series such as to constitute the booster cell section 101 and the first booster cell group $102_1$, clock signals $\Phi_A$ and $/\Phi_A$ are output alternately in every other stage from the clock generating circuit A21. Further, to the booster cells $CP''_{i+1}$ to $CP''_m$, which are connected in series such as to constitute the second booster cell group $102_2$, clock signals $\Phi_B$ and $/\Phi_B$ are output alternately in every other stage from the clock generating circuit B22.

The $V_{XX}$ limiter circuit 300 outputs a voltage detection signal $V_{XX}$FLG which is obtained by comparing an output voltage $V_{XX}$ which is a potential at the output node 110, and a preset voltage, and a voltage detection signal SUBFLG which is obtained by comparing the output voltage $V_{XX}$ and a comparative voltage $V_L$ which is lower than the preset voltage, and thus carries out the detection of voltages of two different levels.

Figure 3A:
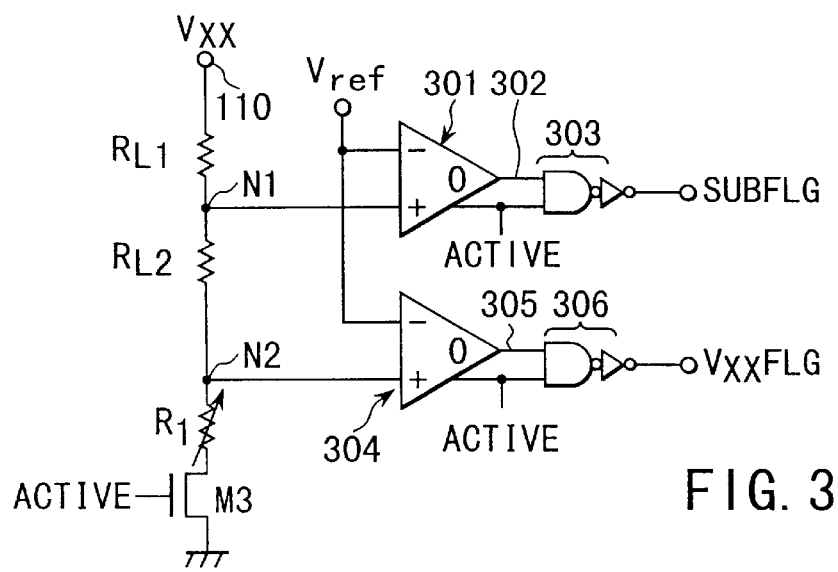
FIGS. 3A and 3B are circuit diagrams equivalent to a limiter circuit shown in FIG. 1.
Figure 3B:
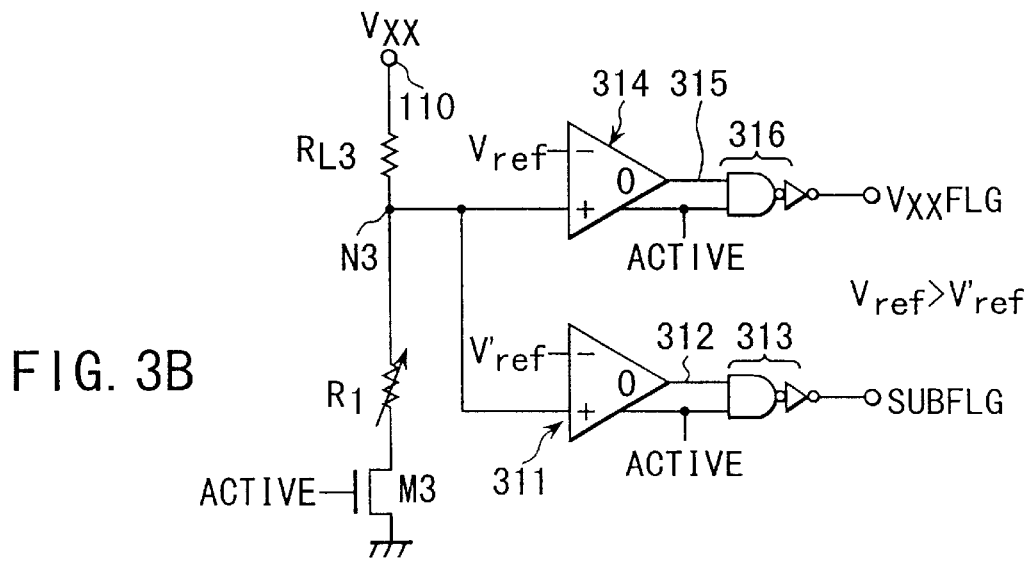

Specific examples of the $V_{XX}$ limiter circuit 300 are shown in FIGS. 3A and 3B. First, the structure of the $V_{XX}$ limiter circuit 300 shown in FIG. 3A will now be described. To the output node 110 of the booster circuit 100, one end of a load resistance $R_{L1}$ is connected. To a connection node N2 on the opposite side to the load resistance $R_{L2}$, one end of an equivalent resistant R1 to a trimming circuit is connected. An NMOS transistor M3 which is switched by an activation signal ACTIVE is connected between the other end of the equivalent resistance $R_1$ and the ground potential. To an output node 302 of a potential comparison circuit 301 for detecting the output voltage $V_{XX}$ by comparing the potential at the connection node N1 and the reference potential $V_{ref}$ to each other, a buffer 303 in which a NAND operator and a NOT operator are connected in series, for outputting a low voltage detection signal SUBFLG which is a detection signal for a comparative voltage $V_L$ lower than the preset voltage, is connected.

To an output node 305 of a potential comparison circuit 304 for detecting the output voltage $V_{XX}$ by comparing the potential at the connection node N2 and the reference potential $V_{ref}$ to each other, a buffer 306 in which a NAND operator and a NOT operator are connected in series, for outputting a voltage detection signal $V_{XX}$FLG which is a detection signal for the preset voltage, is connected.

The equivalent resistance $R_1$ of the trimming circuit is set to such a resistance ratio, $(R_{L1}+R_{L2})/R_1$, that the output voltage $V_{XX}$ at the output node 110 becomes the preset voltage when the potential at the connection node N2 is equal to the reference potential $V_{ref}$. The connection node N1 will have a potential higher than that of the connection node N2 at all times if the division of the resistance is taken appropriately.

In the limiter circuit, when the activation signal ACTIVE is at "L" level, it is cut off by the NMOS transistor M3, and therefore there is no current flowing from the connection node N2. Further, the potential comparison circuits 301 and 304 are set in a non-active state, and the voltage detection signals $V_{XX}$FLG and SUBFLUG are both at "L" level. When the activation signal ACTIVE is set at "H" level, the NMOS transistor M3 is made conductive and the potential compari-son circuits 301 and 304 are set in an active state, thus making it possible to detect the voltage.

Figure 4:
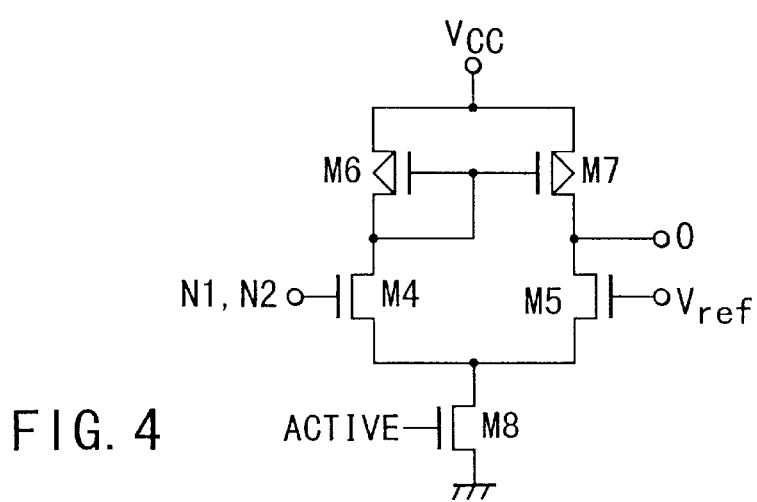
FIG. 4 is a circuit diagram equivalent to a differential amplifier which constitutes a potential comparator circuit of the limiter shown in FIG. 3.

It should be noted that the potential comparison circuits 301 and 304 each are a differential amplifier such as shown in FIG. 4. As shown, to the gate ((+) terminal) of the NMOS transistor M4, the connection nodes N1 and N2 are connected, and to the gate ((−) terminal) of the PMOS transistor M5, the reference potential $V_{ref}$ is connected. One end of the current path of the PMOS transistor M6 is connected to one end of the current path of the PMOS transistor M6. One end of the current path of the NMOS transistor M5 is connected to one end of the current path of the PMOS transistor M7. The connection point between the NMOS transistor M4 and PMOS transistor M6 is commonly connected to the gates of the PMOS transistors M6 and M7. Further, the other end of the current path of the PMOS transistor M6 and the other end of the current path of the PMOS transistor M7 are connected in common, and the common connection point is connected to the power voltage $V_{cc}$. Furthermore, the other end of the current path of the NMOS transistor M4 and the other end of the current path of the NMOS transistor M5 are connected in common. Between the common connection point and the ground, the current path of the NMOS transistor M8 is connected in series. To the gate of the NMOS transistor M8, the activation signal ACTIVE is supplied. In the differential amplifier, when the activation signal ACTIVE is at "H" level, and the potentials at the connection nodes N1 and N2 are higher than the reference potential $V_{ref}$, an "H" level signal is output from the output node O.

Next, the $V_{XX}$ limiter circuit 300 shown in FIG. 3B will now be described. In the limiter circuit shown in FIG. 3B, the output preset voltage $V_{XX}$ is divided by the load resistance $R_{L3}$ and the equivalent resistance R1 of the trimming circuit. Then, the potential at the connection node N3 and the first reference potential $V_{ref}$ are compared with each other by the potential comparison circuit 311, and a low voltage detection signal SUBFLG is output from the buffer 313 as the first voltage detection signal at "H" level. Further, the potential at the connection node N3 and the second reference potential $V_{ref}$ are compared with each other by the potential comparison circuit 314, and a voltage detection signal $V_{XX}$FLG is output from the buffer 316 as the second voltage detection signal. Here, the resistance ratio $R_{L3}/R1$ is set such that the preset voltage $V_{XX}$ is output when the potential at the connection node N3 is equal to the reference potential $V_{ref}$. When, there is a relationship of $V_{ref}>V'_{ref}$, an input/output relationship among $V_{XX}$, $V_{XX}$FLG and SUBFLG, which is similar to the embodiment shown in FIG. 3A, can be obtained.

Figure 5:
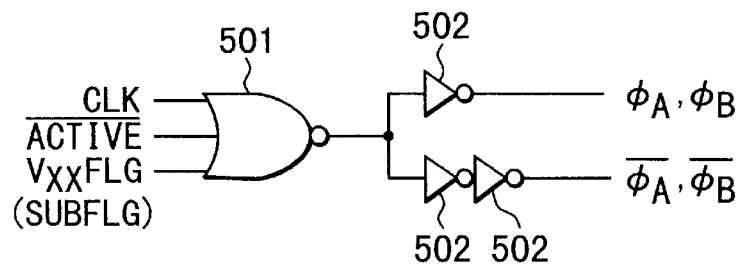
FIG. 5 is a circuit diagram equivalent to a clock generating circuit shown in FIG. 1.

Clock generation circuits A21 and B22 are circuits for generating clock signals used exclusively for driving the booster circuit 100, and the equivalent circuit thereof is shown in FIG. 5. In the clock generation circuits A21 and B22, a clock signal CLK, an activation signal (/ACTIVE) and a potential detection signal ($V_{XX}$FLG or SUBFLUG) are output to a NOR circuit 501, and output signals thereof are output via a single-stage NOT circuit 502 and two-stage NOT circuit 502 as clock signals $\Phi_A$ and $\Phi_B$ or clock signals $/\Phi_A$ and $/\Phi_B$.

That is, when the activation signal /ACTIVE is at "L" level (the activation signal ACTIVE is at "H" level), and a voltage detection signal $V_{XX}$FLG or a low voltage detection signal SUBFLG is at "L" level, clock signals $\Phi_A$ and $/\Phi_A$ or clock signals $\Phi_B$ and $/\Phi_B$ are output at the same period as that of the clock signal CLK which is generated at all times at a predetermined period. Here, it is assumed that the clock signal CLK is commonly used by other booster circuits which operate simultaneously. For example, in the write mode, the clock signal is commonly used by booster circuits for write voltage, booster circuits for write middle voltage, and the like, and the clock signal is generated at all times at a predetermined period during a write mode. It should be noted that clock signals $\Phi_A$ and $/\Phi_A$ are given to the first booster cell section 101 and the first booster cell group $102_1$, and clock signals $\Phi_B$ and $/\Phi_B$ are given to the second booster cell group $102_2$.

Figure 6:
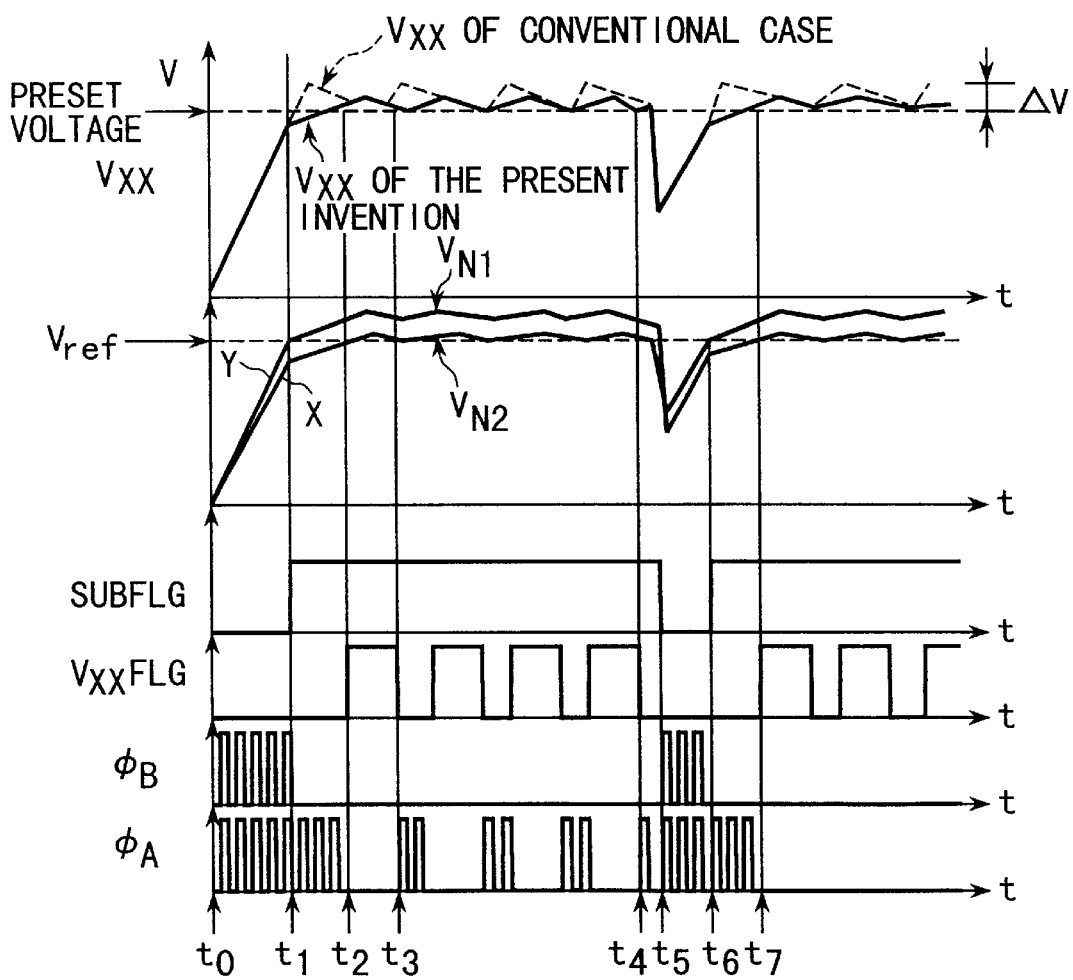
FIG. 6 is a diagram showing a waveform while the internal voltage generating circuit shown in FIG. 1 is in operation.

The waveform during the operation of the internal voltage generating circuit shown in FIG. 1 is shown in FIG. 6. In FIG. 6, the abscissa axis indicates time, whereas the ordinate axis indicates voltage, and thus how each of typical signals changes along with time is shown.

When the activation signal ACTIVE is set at "H" level at time $t_0$, the output voltage $V_{XX}$ has not reached the preset voltage or comparative potential $V_L$; therefore the voltage detection signals $V_{XX}$FLG and SUBFLG output from the $V_{XX}$ limiter circuit 300 are both at "L" level. Consequently, clock signals $\Phi_A$ and $\Phi_B$ are output from the clock generation circuits A21 and B22 at a period of the clock signal CLK, and thus the booster circuit 100 starts a boosting operation.

Here, the first and second booster cell groups $102_1$ and $102_2$ have the same number of booster cells. Further, in FIG. 6, as clock signals $/\Phi_A$ and $/\Phi_B$ having the same phase are input to $CP'_{i+1}$ and $CP''_{i+1}$, the transfer of charge is carried out at the same timing, and thus the booster circuit 100 operates as one booster circuit apparently.

As the potential $V_{XX}$ at the output node 110 increases, the potentials at the connection node N2 and the connection node N1 which are resistance-divided in the limiter circuit 300 shown in FIG. 3A increase in proportional to the potential $V_{XX}$.

As described before, the potential at the connection node N1 is higher than that of the connection node N2, and therefore at a time $t_1$, the potential at the connection node N1 becomes equal to the reference potential $V_{ref}$ earlier than the potential at the connection node N2, and the low voltage detection signal SUBFLG is set at "H" level by the potential comparison circuit 301. As the low voltage detection signal SUBFLG is set at "H" level, the clock generating circuit B22 stops outputting clock signals $\Phi_B$ and $/\Phi_B$. Consequently, the second booster cell group $102_2$ stops its boosting operation, and the boosting by the charge transfer is carried out only by the first booster cell section 101 and the first booster cell group $102_1$. With this operation, the performance of the booster circuit 100 is deteriorated, and therefore during a period in which the voltage detection signal SUBFLG is at "H" level, the slope of the rise waveform becomes gentle.

At a time $t_2$, the potential $V_{N2}$ of the connection node N2 becomes equal to the reference potential $V_{ref}$, and therefore the voltage detection signal $V_{XX}$FLG is set at "H" level. Consequently, the clock generating circuit A21 stops outputting the clock signals $\Phi_A$ and $/\Phi_A$, and the first booster cell section 101 and the first booster cell group $102_1$ stops the boosting operation.

At a time $t_3$, due to a current path made by leak current of the limiter circuit, and load the connected to the booster circuit, or the like, the potentials at the connection nodes N1 and N2 decrease, and therefore the voltage detection signal $V_{XX}$FLG is once again set at "L" level, and the boosting operation is restarted by the first booster cell section 101 and the first booster cell group $102_1$.

At this point, due to the CR delay within the limiter circuit 300, the timing for outputting an "H" level voltage detection signal $V_{XX}$FLG is delayed. Consequently, the overshooting of the potential $V_{XX}$ at the node 110 with respect to the preset voltage is not inevitable; however since the second booster cell group $102_2$ has already stopped and the charge transfer capability of the booster circuit 100 has become less, the potential change $\Delta V$ of the preset voltage can be nmade smaller than that of the conventional example.

At a time $t_5$, where the output voltage $V_{XX}$ is greatly decreased, the potential at the connection node N1, which decreases in proportional to the variation of the output voltage $V_{XX}$, becomes lower than the reference potential $V_{ref}$. In this manner, all of the first booster cell section 101, the first booster cell group $102_1$ and the second booster cell group $102_2$ restart the boosting operation and accelerate the rise as indicated in the period from time $t_5$ to $t_6$.

Here, in order to avoid a significant lowering of the charge transfer efficiency at the output node 111 of the first booster cell section 101, the ratio between the cell size of the booster cells $CP'_{i+1}$ to $CP'_m$ in the first booster cell group $102_1$, and the cell size of the booster cells $CP''_{i+1}$ to $CP''_m$ in the second booster cell group $102_2$, should necessarily be adjusted. Here, the boosting performances of the first booster cell group $102_1$ and the second booster cell group $102_2$ connected in parallel, may be the same or one may be greater than the other. A sum of the cell sizes of the booster cell $CP'_m$ in the cell group $102_1$ of the second booster cell section, and the cell sizes of the booster cell $CP''_m$ in the second booster cell group $102_2$ of the second booster cell section, is made equal to the cell size of the booster cell $CP_i$ of the first booster cell section 101. Further, in the first booster cell group $102_1$ and the second booster cell group $102_2$, the number of stages or the size of each cell is not increased more than it is necessary, and in this manner, the increase in the pattern area can be suppressed and the switching of the boosting performance can be achieved relatively easily.

As described above, the booster circuit 100 sets the second booster cell group $102_2$ in an activation/stop state in accordance with the output voltage, so as to vary the boosting performance of the booster circuit 100 as a whole. In this manner, the output change at the preset voltage can be smallen without significantly changing the rise characteristics.

The internal voltage generating circuit containing the booster circuit can be applied to a variety of devices. For example, it can be applied to an electrically rewritable non-volatile semiconductor memory (EEPROM), or in other types of semiconductor memories, it can be applied to a power for driving word lines, a power for driving dummy word lines, an internal power, a reference potential generating circuit for sensing memory cell array data, and the like.

An example in which the booster circuit according to the present invention is applied to a booster circuit for supplying power to word lines (control gate) and the like, during writing or erasing of data in NAND type EEPROM, will now be described.

Figure 7:
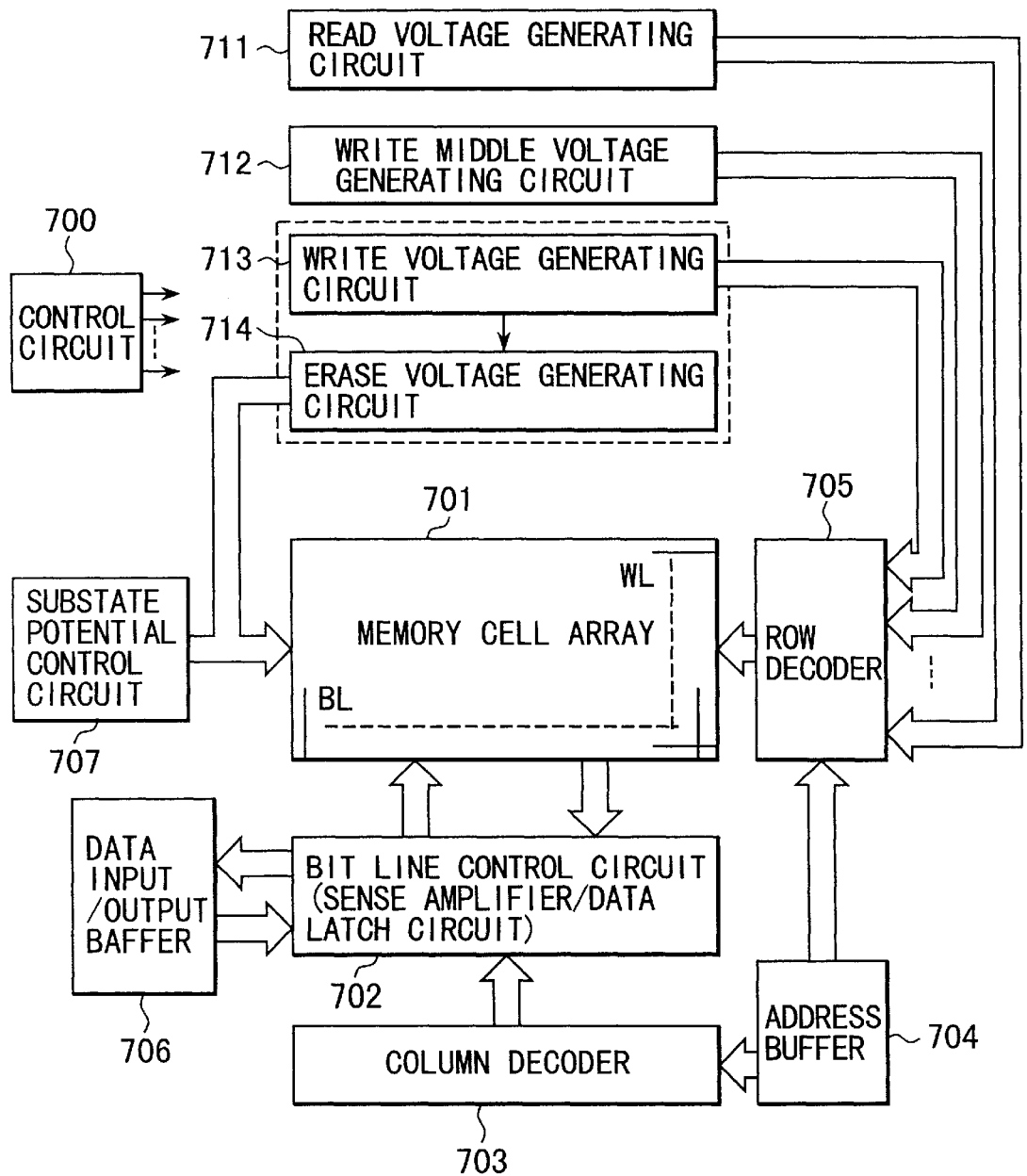
FIG. 7 is a schematic block diagram showing an entire structure of an EEPROM to which the present invention is applied.

FIG. 7 is a block diagram schematically showing an entire structure of an EEPROM to which the present invention is applied.

A memory cell array 701, for example in the case of a NAND type, is made of NAND cell units arranged in matrix as a whole, in which selection gate transistors are connected in series to both ends of the memory cell array connected in series. It should be noted here that as to the constitution of the memory cells, not only the NAND type but also NOR type memory cells or the like may be used.

In the memory cell array 701, a plurality of word lines WL are each connected in common to those cells in the same row and the control gates of the other cells, a selection gate transistor connected to drains of the EEPROM cells, which are located on one side, is connected to bit lines BL, and a selection gate transistor connected to sources of the NAND cells, which are located on the other end side, is connected to common source lines.

A bit line control circuit 702 consists of a column selection switch for carrying out column selection with regard to the memory cell array 701, a sense amplifier write data latch circuit for performing the latching of write data with respect to the memory cell array 701, the sensing operation for reading a bit line potential, the sensing operation for reading out after writing for verification, and the latching rewrite data, bit line drivers for supplying predetermined voltages to the bit lines, and the like, and the circuit 702 is connected to a data input/output buffer 706.

The column decoder 703 decodes a column address signal from an address buffer 704, and controls the column selection switch by a decode output.

A row decoder 705 consists of a decoder circuit for decoding a row address signal from the address buffer 704, and word line drivers for supplying a predetermined necessary voltage to each of word lines WL and selection gates in accordance with the decode output.

To the word line drivers of the row decoder 705, a predetermined voltage is supplied from a read voltage generating circuit 711, a write middle voltage generating circuit 712 and a write high voltage generating circuit, other than the power potential or ground potential. Further, to the bit line drivers of the bit line control circuit 702, the power potential, ground potential and the like are supplied.

A substrate potential control circuit 707 is provided to control the potential of a p well with which the memory cell array 701 is formed, and a voltage is supplied thereto from a erase voltage generating circuit 714 of the present invention.

Four voltage generating circuits 711 to 714 are each made of a voltage generating circuit shown in FIG. 1, and provided inside a chip. The circuits 711 to 714 generate a write voltage $V_{PGM}$ (to 20V) necessary for writing data to the memory cell, a write medium voltage (to 10V), a read voltage (to 4.5V) necessary for verification after writing or reading, and an erase voltage $V_{ERA}$ (to 20V) necessary for erasing data written in the memory cell array 701, by boosting the power potential.

It is most preferable that the voltage generating circuit of the present invention should be applied to a write voltage generating circuit 713 and a erase voltage generating circuit 714, for generating particularly high voltages, and the conventional circuits may be used for the write middle voltage generating circuit 711 and the read voltage generating circuit 712.

The control circuit 700 is provided for controlling the internal operation of the chip, and as an interface with external devices. The circuit 700 includes a sequence control section (for example, programmable logic array) for controlling erasing/verifying erase/writing/verifying write/read, with respect to the cells.

It is desired that the write voltage to a memory cell of the EEPROM could be controlled at high efficiency. When the section of the booster circuit in the internal voltage generating circuit, taken from the middle node to the output, is made parallel, and the performance of the booster circuit is switched in accordance with the output potential, the variation of the preset potential can be made small without significantly deteriorating the rise characteristics.

Second Embodiment

Figure 8:
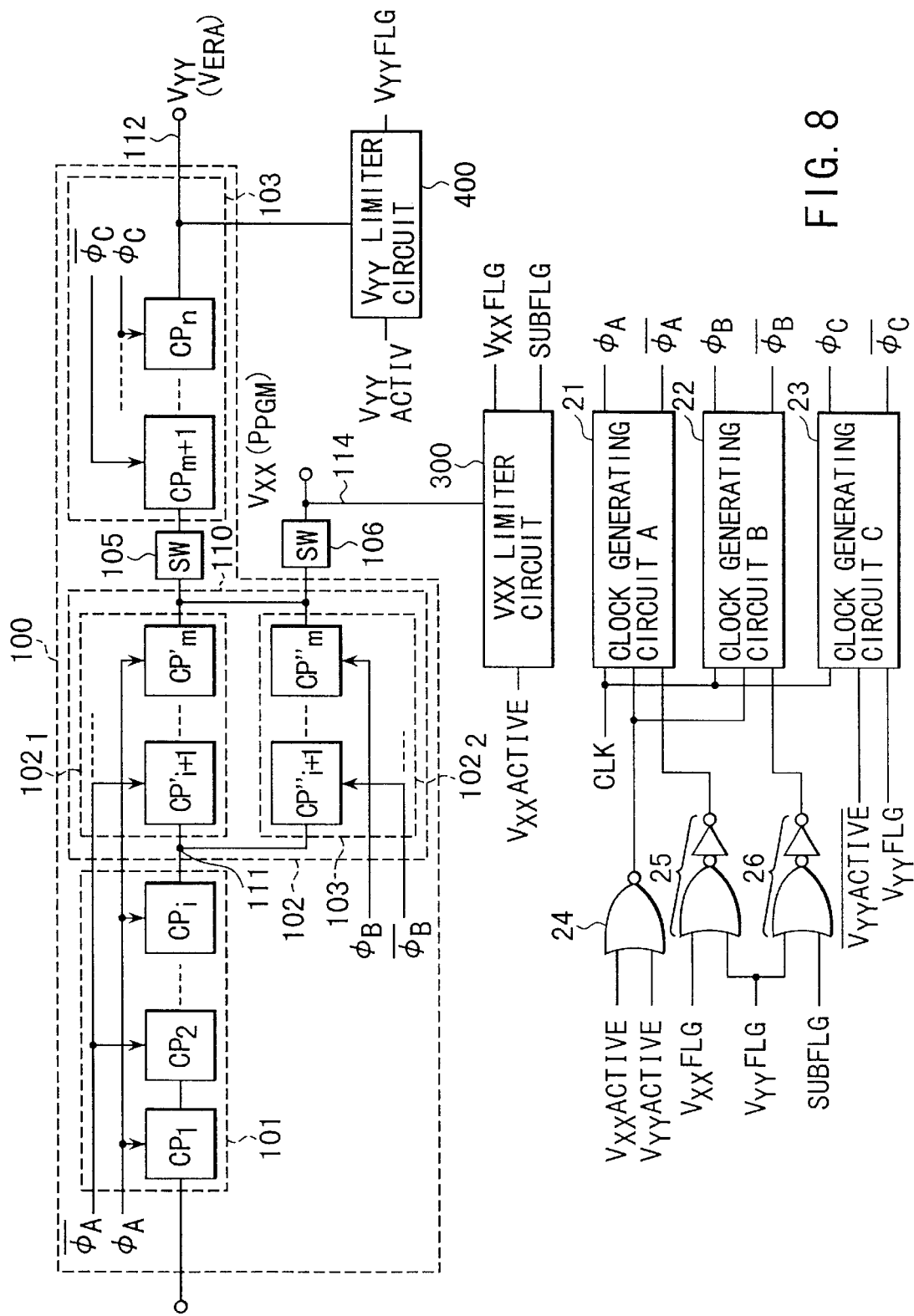
FIG. 8 is a circuit diagram equivalent to an internal voltage generating circuit including a booster circuit according to the second embodiment of the present invention.

As the internal voltage generating circuit shown in FIG. 1 is further expanded, a voltage generating circuit as shown in FIG. 8 can be obtained. It should be noted here that the same structural members as those of FIG. 1 are designated by the same reference numerals, and the explanations therefor will not be repeated.

In the voltage generating circuit shown in FIG. 8, a third booster cell section 103 in which an (n–m) (n–m≧1) number of booster cells $CP_{m+1}$ to $CP_n$ are connected to each other in series, is connected to the output node 110 of a first booster cell group $102_1$ via a switch circuit 105 which is made of a transfer gate. A $V_{YY}$ limiter circuit 400 is connected to the output node 112 of the third booster cell section 103. Further, a switch circuit 106 made of a transfer gate is connected to the output node 110 of the first booster cell group 102, and a $V_{XX}$ limiter 300 is connected to an output node 114 of a switch circuit 106.

The $V_{XX}$ limiter 300 is activated when the activation signal $V_{XX}$ACTIVE is at "H" level, and outputs voltage detection signals $V_{XX}$FLG and SUBFLG, which are detection results of the output potential $V_{XX}$ at the output node 114. The $V_{YY}$ limiter 400 is activated when the activation signal $V_{YY}$ACTIVE is at "H" level, and outputs a voltage detection signal $V_{YY}$FLG, which is a detection result of the output potential $V_{YY}$ at the output node 112. That is, the booster circuit 100 of the voltage generating circuit has two output nodes for outputting boosted voltages, namely, the output nodes 112 and 114.

The activation signals $V_{XX}$ACTIVE and $V_{YY}$ACTIVE are input to a NOR circuit 24, and an output from the NOR circuit 24 is input to clock generation circuits A21, B22 and C23. In the meantime, voltage detection signals $V_{XX}$FLG and $V_{YY}$FLG are input to an OR circuit 25 in which a NOR circuit and a NOT circuit are connected in series, and an output from the OR circuit 25 is input to the clock generation circuit A21. Voltage detection signals $V_{YY}$FLG and SUBFLG are input to an OR circuit 26 in which a NOR circuit and a NOT circuit are connected in series, and an output from the OR circuit 26 is input to the clock generation circuit B22. Further, a clock signal CLK having a predetermined period is input to the clock generation circuits A21, B22 and C23.

Clock signals $\Phi_A$ and $/\Phi_A$ are output from the clock generating circuit A21 to the first booster cell section 101 and the first booster cell group $102_1$. Clock signals $\Phi_B$ and $/\Phi_B$ are output from the clock generating circuit B22 to the second booster cell group $102_2$. Clock signals $\Phi_C$ and $/\Phi_C$ are output from the clock generating circuit C23 to the third booster cell section 103.

The first switch circuit 105 is turned on when the activation signal $V_{YY}$ACTIVE is at "H" level, and turned off when the signal is at "L" level, and the second switch circuit 106 is turned on when the activation signal $V_{XX}$ACTIVE is at "H" level, and turned off when the signal is at "L" level. In this manner, a boosted voltage ($V_{XX}$ or $V_{YY}$) is output from either one of the output node 112 and the booster node 114.

In the case of this circuit, the potential $V_{YY}$ at the output node 112 is higher than the potential $V_{XX}$ at the booster node 114, and the performance of the third booster cell section 103 is determined in accordance with a necessary potential difference or a difference in performance.

For example, the potential $V_{XX}$ is a write voltage VPGM with respect to memory cells of the EEPROM shown in FIG.

7, whereas the potential VYY is an erase voltage $V_{ERA}$ which requires the capability of a booster circuit even at a higher voltage. The write voltage $V_{PGM}$ and erase voltage $V_{ERA}$ are not used at the same time, and each of them outputs a voltage as high as around 20V, and therefore the pattern area of the booster circuit is very large. Therefore, it is very advantageous to use the booster circuits of both in common as described.

First, in the case where the circuit is used as the $V_{XX}$ ($V_{PGM}$) generating circuit (for example, the write voltage generation circuit 713 shown in FIG. 7), the switch circuit 105 is turned off, the switch circuit 106 is turned on, and the activation signal $V_{XX}$ACTIVE is set at "H" level, so as to activate the clock generation circuits A21 and B22 and the $V_{XX}$ ($V_{PGM}$) limiter circuit 300. Thus, these circuits can be used as being operated in the same manner as in the first embodiment.

Next, in the case where the circuit is used as the $V_{YY}$ ($V_{ERA}$) generating circuit (for example, the erase voltage generation circuit 714 shown in FIG. 7) is used, the activation signal $V_{YY}$ACTIVE is set at "H" level, so as to activate the clock generation circuits A21, B22 and C23.

On the other hand, when the activation signal $V_{XX}$ACTIVE is at "L" level, the $V_{XX}$ limiter circuit 300 is not activated, and therefore, the voltage detection signals $V_{XX}$FLG and SUBFLG are at "L" level. Consequently, the voltage detection signal $V_{YY}$FLG is input to the clock generation circuits A21 and B22 by the OR circuits 25 and 26.

Therefore, in order to boost $V_{YY}$, the switch circuit 105 is turned on, the switch circuit 106 is turned off, the activation signal $V_{XX}$ACTIVE is set at "L" level, and the activation signal $V_{YY}$ACTIVE is set at "H" level. In this manner, all of the clock signals $\Phi_A$, /$\Phi_A$, $\Phi_B$, /$\Phi_B$, $\Phi_C$ and /$\Phi_C$ and all of the booster cell sections 101, 102 and 103 are used to control the boosting operation.

When the voltage $V_{YY}$ of the output node 112 reaches the preset voltage, the voltage detection signal $V_{YY}$FLG is set at "H" level, and therefore all the clock signals are stopped and the boosting operation stops. In this manner, the booster circuits for $V_{XX}$ ($V_{PGM}$) and $V_{YY}$ ($V_{ERA}$) operate as one booster circuit apparently.

Here, the switch 105 is provided to shut off the current path to the third booster cell section 103 when there is an output of $V_{XX}$ ($V_{PGM}$).

Third Embodiment

Conventionally, in the writing and erasing operations, the timing for applying a write voltage or an erase voltage to a cell, and the timing for discharging therefrom are controlled, and thus the write time and erase time are set.

In the case of the above-described booster circuit consisting of a plurality of booster cell sections, the slope of the waveform of the rise voltage becomes in some cases too gentle. When the slope of the waveform of the rise voltage is excessively gentle due to the influence of the dispersion of the characteristics and the worst case of the conditions in which the circuit is used, a more time is required before reaching the preset voltage at the conventional writing and erasing timings, thereby shortening the substantial write voltage applying time and erase voltage applying time. Thus, the number of loops for a write and a read for verifying the write, or an erase and a read for verifying the erase, is increased. In the loops, the same operation is repeated, and therefore the write time and erase time are in some cases unnecessarily prolonged.

Further, in a NAND type EEPROM having an ordinary booster circuit, for example, when the write voltage varies regardless of the dispersion, or the write unit varies from 1 page to a number of pages, the time in which a preset voltage is actually applied varies. If the substantial write time is shortened, the writing is insufficiently performed, and therefore, in some cases, the data must be rewritten.

This is also the case in the erasing operation, for example, there may be a significant difference in terms of the degree of the charge for the erase voltage $V_{ERA}$ between the case where a single block is erased, and the case where multiple blocks in which a plurality of blocks are selected, are erased.

Therefore, in consideration of the change in the load size and the dispersion of conditions, the number of loops of a write and reading for verification or an erase and reading for verification is likely to increase in the worst case with respect to the case where a write and an erase can be performed quickly. If the conditions are set for the worst case, the rises of the write and erase voltages becomes excessively steep when the writing or erasing can be performed quickly. As a result, the overshooting easily occurs with respect to the predetermined voltage value, and the write and erase characteristics with respect to the cells easily disperse.

In order to avoid this, the NAND-type EEPROM of this embodiment discharges a predetermined time, that is, the voltage applying time, after the write or erase voltage rises to the predetermined voltage.

Figure 9:
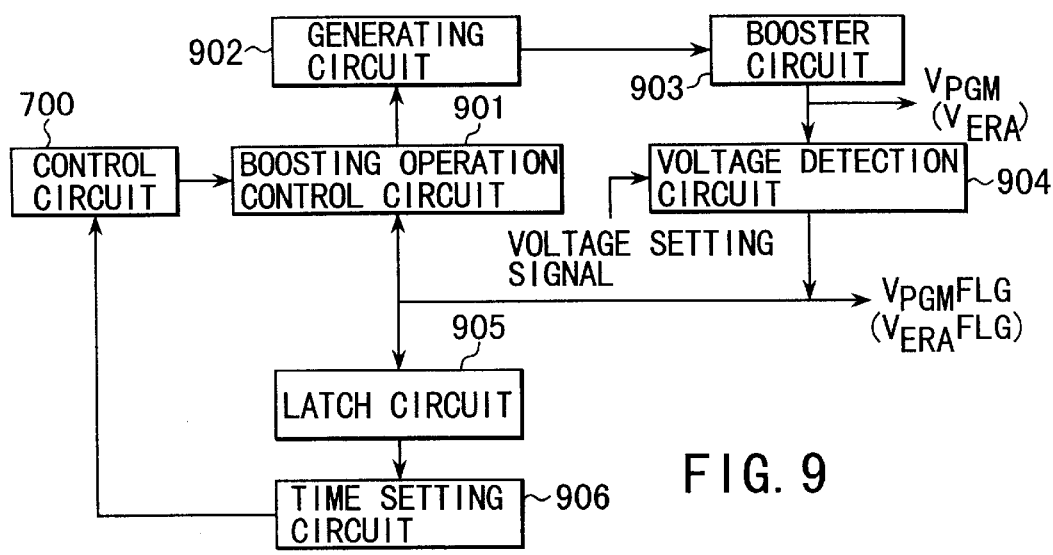
FIG. 9 is a block diagram showing an EEPROM according to the third embodiment.

FIG. 9 is a block diagram showing the structure of the voltage generation circuit of a NAND-type EEPROM according to the third embodiment of the present invention. As shown, a boosting operation control circuit 901 for controlling a write/erase operation in accordance with a signal from the control circuit 700 is provided. Further, an oscillation circuit 902 for generating a clock signal 902 used for a boosting operation in accordance with a signal from the boosting operation control circuit 901 and a voltage detection signal, which will be later explained, is provided. A booster circuit 903 for generating a write voltage $V_{PGM}$ or an erase voltage $V_{ERA}$ in accordance with a clock signal from the oscillation circuit 902, is connected. It should be noted that the booster circuit may be a type described before, or the conventional type.

An output voltage from the booster circuit 903 is supplied to a memory cell, and the voltage value is detected by the voltage detection circuit 904. The voltage detection circuit 904 outputs a voltage detection signal $V_{PGM}$FLG or $V_{ERA}$FLG in accordance with the voltage input or voltage setting signal. Then, the voltage detection signal $V_{PGM}$FLG ($V_{ERA}$FLG) is input to the boosting operation control circuit 901 and the latch circuit 905. A time setting circuit 906 for controlling a time period in which a predetermined voltage is supplied, after the write (erase) voltage has reached the preset voltage, is connected to the latch circuit 905. A signal Timer is fed back from the time setting circuit 906 to the control circuit 700.

Figure 10:
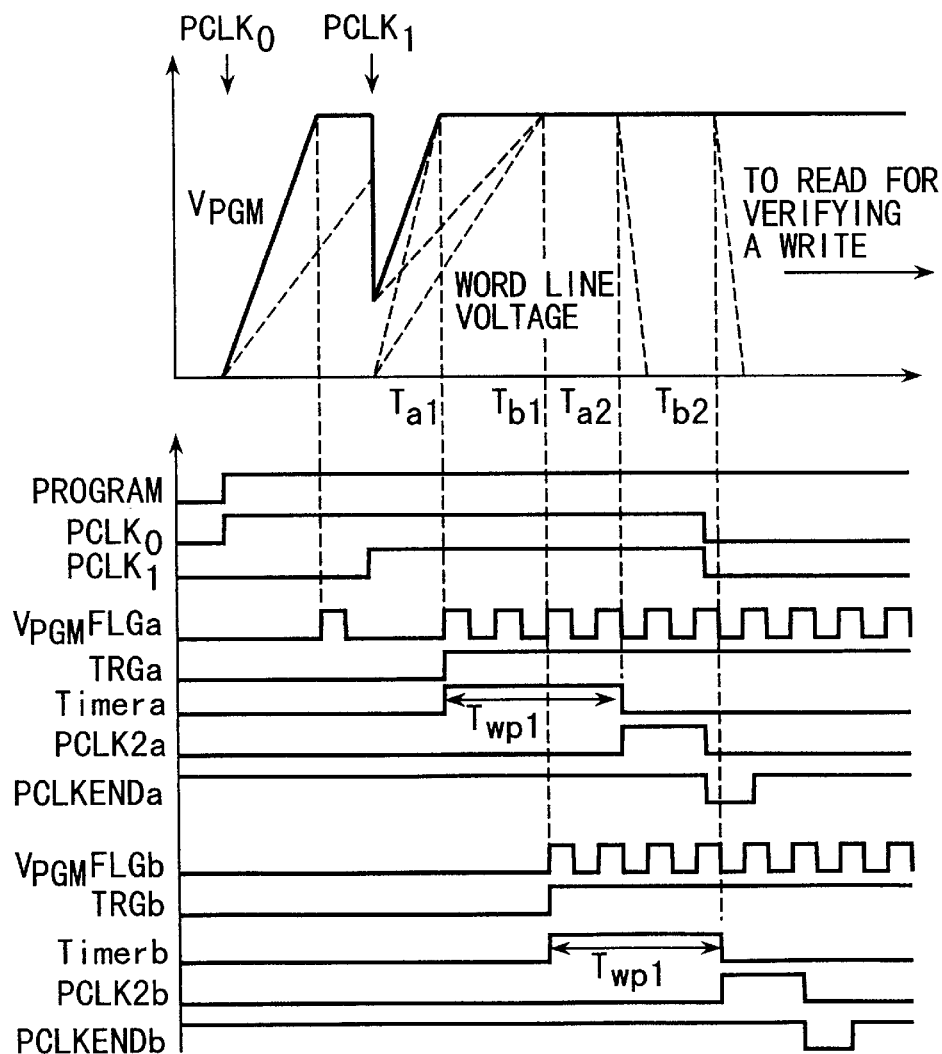
FIG. 10 is a diagram showing an operating waveform during writing data into the EEPROM shown in FIG. 9.

FIG. 10 shows a waveform of the case where the embodiment is applied to the writing operation. In the writing operation, a signal PROGRAM from the control circuit 700 is set at "H" level, and the clock signal PCLK from the boosting operation control circuit 901 is set at "H" level; therefore the booster circuit 903 used in the writing system becomes active, and an output voltage (write voltage $V_{PGM}$) from the booster circuit 903 is boosted. During a period from the point where the clock signal CLK becomes "H" level to the point where the clock signal PCLK$_1$ becomes "H" level, there are some operations carried out, for example, write data is transferred to a bit line. When the clock signal $PLCK_1$ becomes "H" level, a write voltage $V_{PGM}$ is applied to a word line from the booster circuit 903. At this time, since the word line and some other parasitic load are connected, the write voltage $V_{PGM}$ is once lowered. In this manner, after the signal $PLCK_1$ is set at "H" level, the write voltage $V_{PGM}$ is applied to the control gate of the memory cell, thus writing data therein.

In such a waveform (indicated by solid line in FIG. 10, to be referred to as waveform A) that the rise of the write voltage $V_{PGM}$ is quick, the voltage reaches the preset voltage at a time $T_{a1}$, whereas in such a waveform (indicated by broken line in FIG. 10, to be referred to as waveform B) that the rise of the write voltage $V_{PGM}$ is slow, the voltage reaches the preset voltage at a time $T_{b1}$.

When the voltage detection circuit 904 detects that the voltage has reached the preset voltage, the voltage detection signal $V_{PGM}FLG$ is set at "H" level. When the voltage detection signal $V_{PGM}FLG$ ($V_{PGM}FLG_a$, $V_{PGM}FLG_b$) is set at "H" level, a trigger signal TRG ($TRG_a$, $TRG_b$) output from the latch circuit 905 is set at "H" level.

When the trigger signal TRG is set at "H" level, a time setting circuit 906 starts. At a time $T_{wp}$ ($T_{wp1}$, $T_{wp2}$) after the trigger signal TRG has become "H" level, a signal Timer is output to the control circuit 700. Upon inputting the signal Timer, the control circuit 700 outputs a signal $PLCK_2$ to the boosting operation control circuit 901 and other circuits for the writing system.

In the case of the waveform A, after an elapse of a time $T_{wp1}$, which is determined by the time setting circuit, from the time $T_{a1}$, a signal $PLCK_{2a}$ is set to "H" level at a time $T_{a2}$ ($T_{a1}+T_{wp1}$), and the word line is discharged. In the case of the waveform B, after an elapse of a time $T_{wp2}(=T_{wp1})$ from the time $T_{b1}$, a signal $PLCK_{2a}$ is set to "H" level at a time $T_{b2}$ ($T_{b1}+T_{wp2}$), and the word line is discharged.

If the dispersion of the application time Twp of the actual write setting voltage ($V_{PGM}$), set by the time setting circuit, and the dependency on the conditions can be reduced, the time for one writing operation can be somewhat prolonged; however in both cases of the waveforms A and B, substantially the same writing can be performed.

Figure 11:
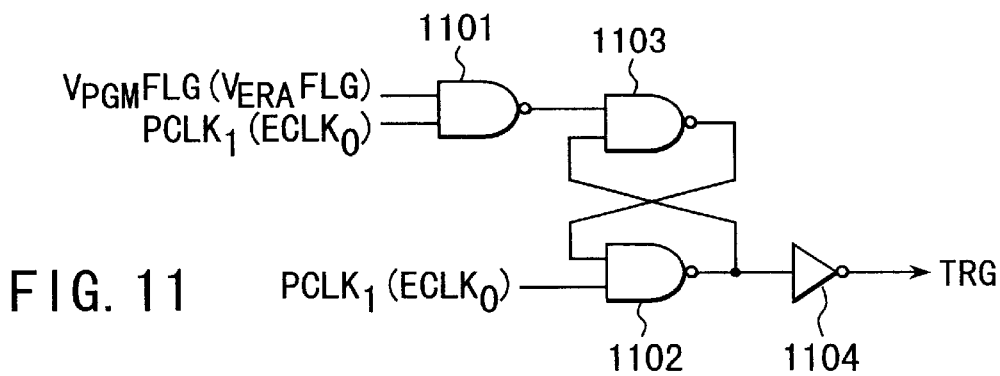
FIG. 11 is a circuit diagram showing the structure of a latch circuit of the EEPROM shown in FIG. 9.

Next, a specific example of the latch circuit 905 for detecting the timing at which the write voltage $V_{PGM}$ has become the preset voltage, will now be described. FIG. 11 is a circuit diagram showing the structure of the latch circuit.

As shown in FIG. 11, the voltage detection signal $V_{PGM}FLG$ ($V_{ERA}FLG$) and clock signal $PLCK_1$ ($ECLK_0$) are input to a NAND circuit 1101. An output from the NAND circuit 1101 and an output from a NAND circuit 1102 are input to a NAND circuit 1103. An output from the NAND circuit 1103 and signal $PLCK_1$ are input to the NAND circuit 1102. An output from the NAND circuit is output as a trigger signal TRG, via a not circuit 1104.

In the wiring operation, first, the operation mode is determined and the write voltage $V_{PGM}$ is risen. As to the memory to which a page is written, it is necessary to transfer write data to a bit line from the data latch circuit contained in the bit line control circuit, and a write voltage $V_{PGM}$ is applied to a word line after a predetermined time. Therefore, in the case where the write voltage $V_{PGM}$ rises very quickly, a stop flag ($V_{PGM}FLG_a$) of the charge pump circuit appears before the connection of the word line as can be seen in the waveform A shown in FIG. 9. Or in the case where the operation proceeds to the writing of the second time onwards by failing the verification of the write, the booster circuit for generating the write voltage $V_{PGM}$ is not able to know if the write voltage $V_{PGM}$ has reached after a write voltage was applied to the words line, as in the case where the preset voltage is maintained without discharging it. Therefore, the signal $PLCK_1$ and signal $V_{PGM}FLG$ are used.

In the case of other than the writing, the signal $PLCK_1$ is at "L" level, and therefore a signal TRG which serves as a trigger for the time setting circuit is set to "L" level by the NAND circuit 1102 and the inverter 1104.

When the operation proceeds to the writing operation and the signal $PLCK_1$ becomes "H" level, a stand-by state for a trigger (TRG) set by an output of the signal $V_{PGM}FLG$ is established. When the voltage detection signal $V_{PGM}FLG$ which serves as a boosting stop signal is set at "H" level after the signal $PLCK_1$ is set at "H" level, the trigger signal TRG is set to "H" level by the NAND circuits 1101 and 1103. Once the trigger signal TRG is set to "H" level, the value of the flag $V_{PGM}FLG$ will not be influenced thereafter.

Then, by the trigger signal TRG, the time setting circuit 906 for determining a predetermined time width $T_{wp}$ is started. The time setting circuit 906 may be of any type as long as it functions as a timer, for example, it may be a delay circuit which delays by a time $T_{wp}$ using one circuit. Or, on the basis of a delay circuit which can set a desired unit time, the time $T_{wp}$ may be counted by using a counter circuit. It should be noted that the time setting circuit 906 should necessarily be a type whose setting time does not vary even if the operational conditions and the like change.

Figure 12A:
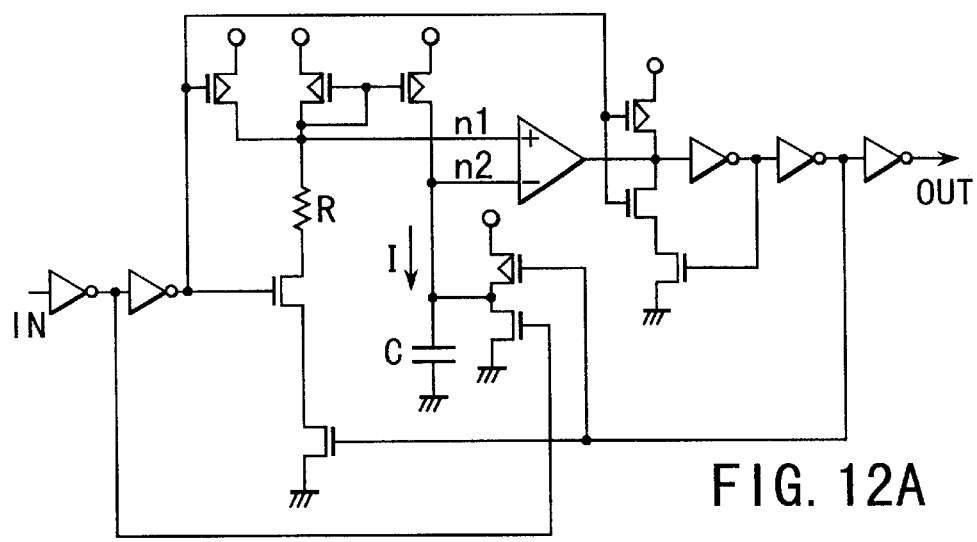
FIG. 12A is a circuit diagram showing the structure of a delay circuit.
Figure 12B:
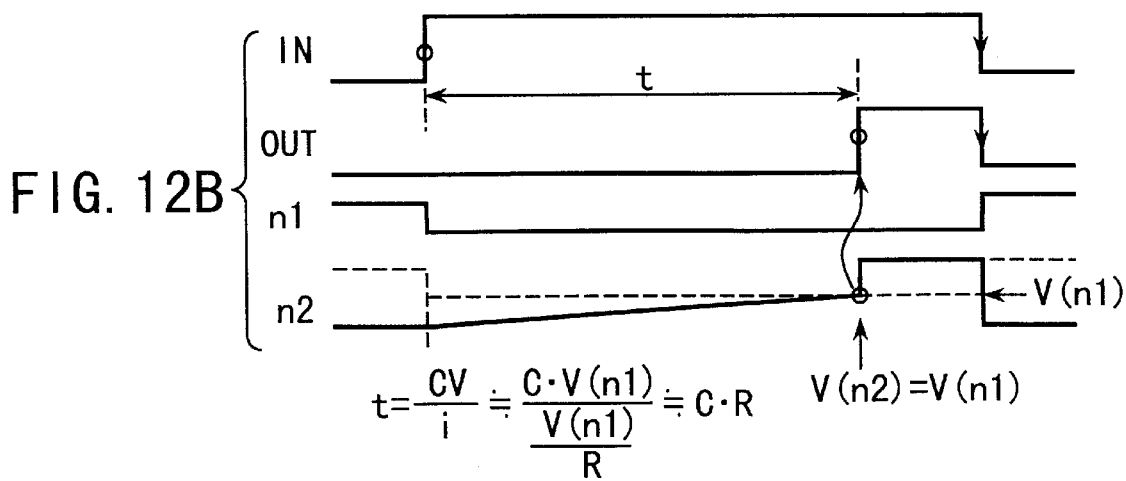
FIG. 12B is a diagram showing an operating waveform of the delay circuit shown in FIG. 12A.

Here, an example of the delay circuit is shown in FIG. 12A. This circuit is a delay circuit only for rise, and the delay time thereof is determined by the product of the resistance element R and capacitance element C, shown in the circuit diagram. With this structure, the circuit is not easily influenced by the dispersion of the threshold voltage $V_{th}$ of the transistor. The operation of his delay circuit is shown in the waveform diagram of FIG. 12B.

Figure 13A:
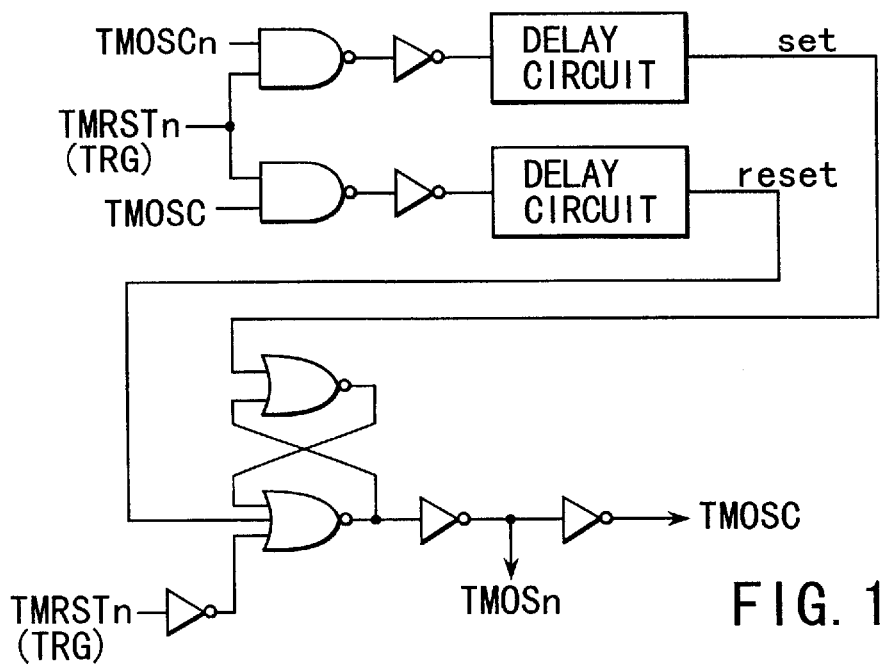
FIG. 13A is a circuit diagram showing the structure of a clock generating circuit for a counter circuit which is based on the delay circuit.
Figure 13B:
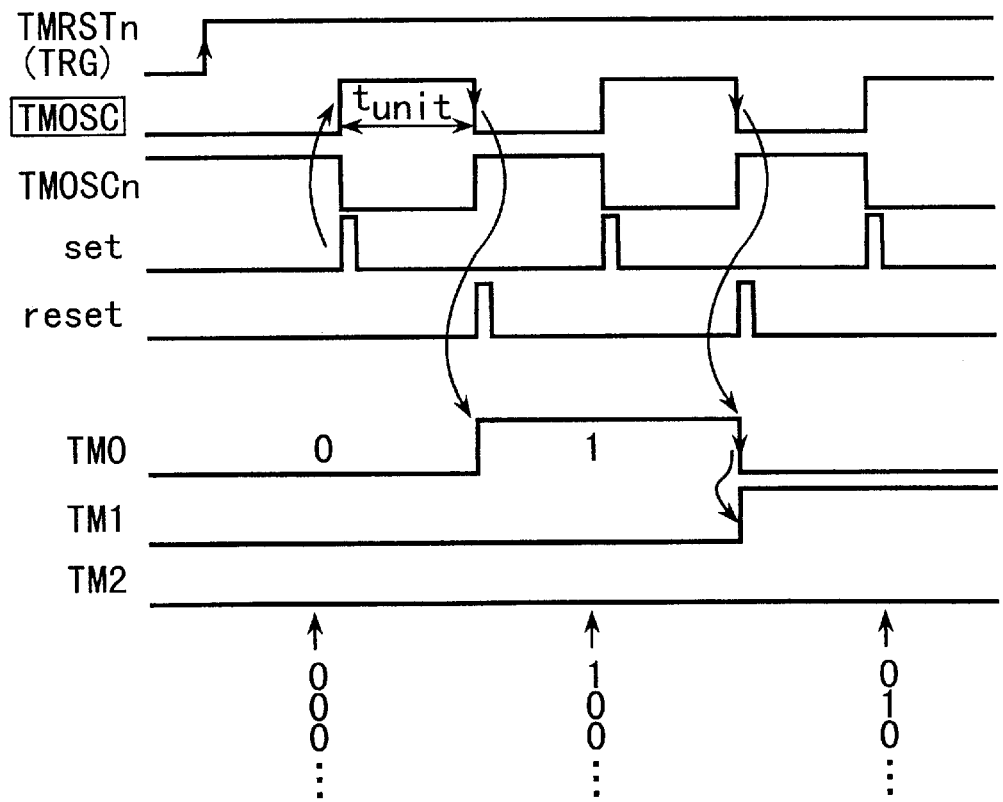
FIG. 13B is a diagram showing an operating waveform of the counter circuit shown in FIG. 13A.

An example of the counter circuit formed based on the delay circuit is shown in FIG. 13A. The delay circuit which sets a unit time (Tunit) should preferably be of a type which does not depend upon the operation conditions, and therefore such a delay circuit as shown in FIG. 12A is used. If such a counter circuit as shown in FIG. 13A is used, it becomes possible to generate a clock signal ($T_{MOSC}$) having a period of 2Tunit as shown in the operational waveform of FIG. 13B. From the clock $T_{MOSC}$, signals $T_{M0}$, $T_{M1}$, . . . , are formed by the counter circuit, and a desired time can be set by a combination of $T_{M1}$, $T_{M2}$, . . .

It should be noted that when the structure of the circuit shown in FIG. 9 is applied to the erase voltage generating circuit, the shown circuit structure can be used in the erasing operation. In actual use, it may be considered that the size of the load is substantially fixed for writing. However, for erasing, the case may vary from erasing a single block to erasing a plurality of blocks selected at the same time. Thus, in some cases, the charge load capacity taken from the charge pump circuit of the erase voltage generating circuit varies in great deal for an ordinary erasing operation.

Figure 14:
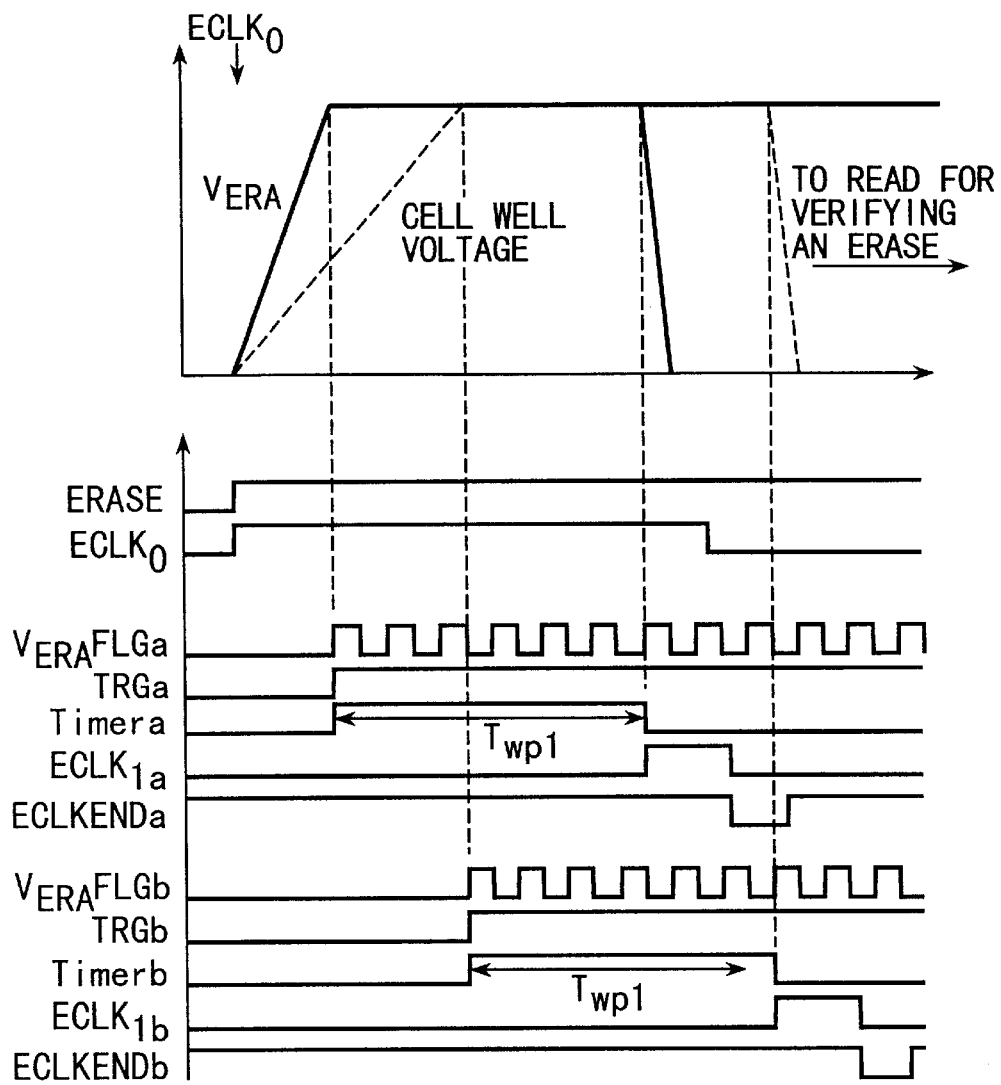
FIG. 14 is a diagram showing an operating waveform during erasing data from the EEPROM shown in FIG. 9.
Figure 15:
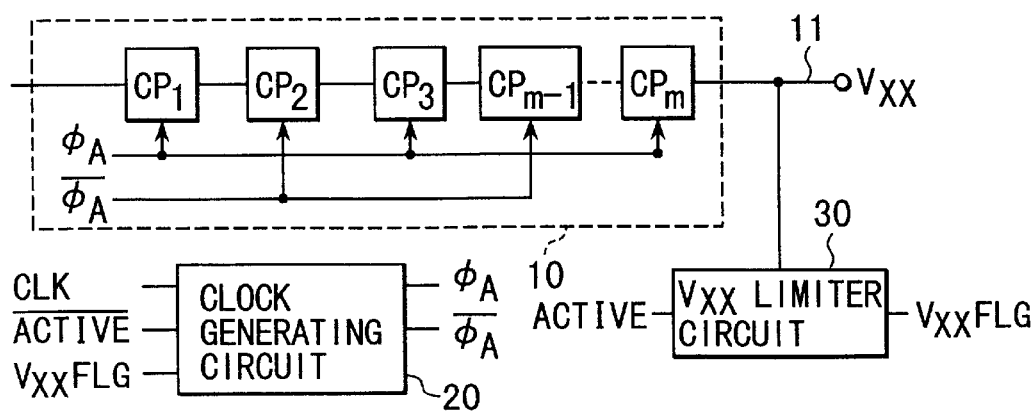
FIG. 15 is a circuit diagram equivalent to a conventional internal voltage generating circuit.
Figure 16:
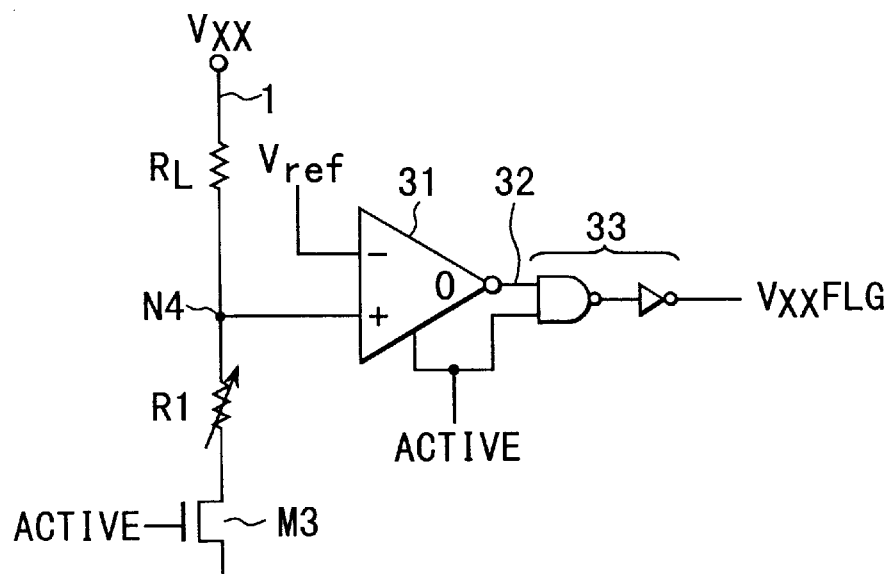
FIG. 16 is a circuit diagram equivalent to a limiter circuit shown in FIG. 15.
Figure 17:
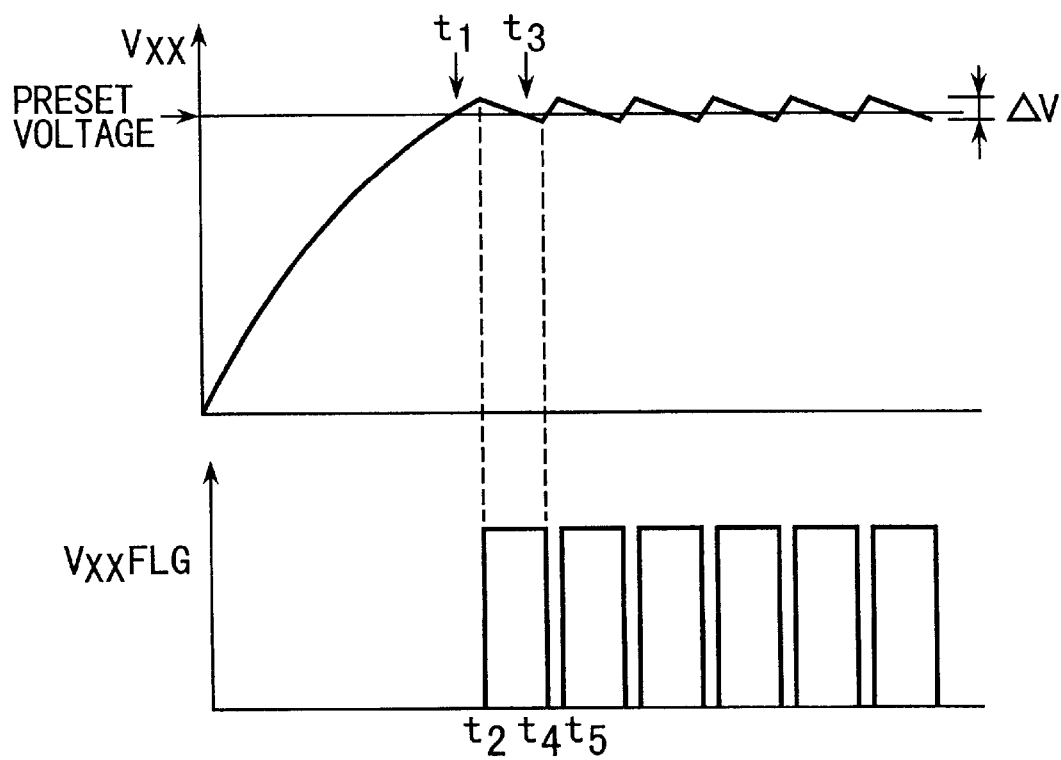
FIG. 17 is a diagram showing an operating waveform during the internal voltage generating circuit shown in FIG. 15 is in operation.

FIG. 14 shows main waveforms used for the erasing operation. The rise of the erase voltage $V_{ERA}$ applied to the well of a cell varies from case to case to create differences even for the charge of the same load capacitance, due to the dispersion of chip characteristics, and the dispersion of the operational conditions. In the erasing of multi-blocks, when the number of selected blocks changes, the charge load capacitance varies, and therefore there is a further difference created in terms of the rise characteristics. In order to avoid this, a similar control to the case of the wiring is carried out, such a waveform as shown in FIG. 14 is obtained, and therefore it becomes possible to avoid the dispersion of the erasing operation for a cell from one case to another.

It should be noted that the present invention is not limited to the above-described embodiments. For example, in the above embodiments, two booster cell groups are connected in parallel; however it is possible that three or more booster cell groups are connected in parallel. In the case where three or more booster cell groups are connected in parallel, the detection of voltage values is not limited to two, but more voltage values are detected, and therefore it is possible to change the performance of the booster cell groups connected in parallel, in accordance with the results of the detection.

Apart from above, the present invention can be modified into various different versions as long as the essence of the invention remains within its scope.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A booster circuit comprising:
   a first booster cell section in which one or more booster cells are connected in series; and
   a second booster cell section having an end which is connected to the first booster cell section, in which a plurality of booster cell groups each containing one or more booster cells connected in series, are connected to each other in parallel.

2. A booster circuit according to claim 1, wherein when an output voltage from the output terminal of the second booster cell section is at a predetermined voltage or less, all the cells of the second booster cell section are in an active state, and when the output voltage is at the predetermined voltage or higher, some of the booster cell groups in the second booster cell section are in an active state.

3. A booster circuit according to claim 1, wherein a boosting capability of the booster cell in the first booster cell section is equal to a sum of the boosting capabilities of corresponding booster cells which constitute each booster cell group of the second booster cell section.

4. A booster circuit according to claim 1, wherein the booster circuit which further comprises:
   a first switch circuit having one end connected to the output terminal of the second booster cell section;
   a third booster cell section having one end connected to the first switch circuit, in which one or more booster cells are connected in series; and
   a second switch circuit connected to a connection point between the second booster cell section and the first switch circuit.

5. A booster circuit according to claim 1, wherein when an voltage is output from the third booster cell section, the boosting operations of the first, second and third booster cell sections are controlled in batch.

6. A voltage generating circuit comprising:
   a booster circuit having a first booster cell section in which one or more booster cells are connected in series, and a second booster cell section having an end which is connected to the first booster cell section, in which a plurality of booster cell groups each containing one or more booster cells connected in series, are connected to each other in parallel;
   a voltage detection circuit for detecting an output voltage from the booster circuit; and
   a boost control circuit for controlling the boosting operation of the first booster cell section, and the boosting operations of the cells in the second booster cell section, on the basis of the results of the detection by the voltage detection circuit.

7. A voltage generating circuit according to claim 6, wherein one of the voltage detection circuit and the first voltage detection circuit detects a first voltage which is lower than a maximum boosted voltage by the booster circuit; and
   the control circuit controls a boosting operation of first and second booster cell sections in accordance with a result of the detection of the first voltage, and controls a boosting operation of each booster cell in the second booster cell section in accordance with a result of the detection of the second voltage.

8. A voltage generating circuit according to claim 6, wherein the booster circuit further comprising: a first switch circuit having one end connected to an output terminal of the second booster cell section, a third booster cell section having one end connected to the fist switch circuit, in which one or more booster cells are connected in series, and a second switch circuit connected to a connection point between the second booster cell section and the first switch circuit;
   and the voltage generating circuit further comprises:
      a first voltage detection circuit for detecting an output voltage from the other end of the second switch circuit;
      a first boost control circuit for controlling the boosting operation of the first booster cell section, and the boosting operations of the cells in the second booster cell section, on the basis of the results of the detection by the first voltage detection circuit; a second voltage detection circuit for detecting an output voltage from the other end of the third booster cell section; and
      a second boost control circuit for controlling the first, second and third booster cell sections in batch, on the basis of the results of the detection by the second voltage detection circuit.

9. A voltage generating circuit according to claim 6, wherein one of the voltage detection circuit and the first voltage detection circuit detects a first voltage which is lower than the maximum boosted voltage of the booster circuit, and a second voltage which is lower than the first voltage; and
   the control circuit controls the boosting operations of the first and second booster cell sections on the basis of the results of the detection of the first voltage, and the boosting operations of the booster cells of the second booster cell section on the basis of the results of the detection of the second voltage.

10. A semiconductor memory comprising:
    a booster circuit having a first booster cell section in which one or more booster cells are connected in series, and a second booster cell section having an end which is connected to an output terminal of the first booster cell section, in which a plurality of booster cell groups each containing one or more booster cells connected in series, are connected to each other in parallel; and
    a memory cell array on which writing, reading and erasing of data are carried out in accordance with the output voltage from the booster circuit.

11. A semiconductor memory according to claim 10, further comprising:
- a voltage detection circuit for detecting that the output voltage from the booster circuit reaches a predetermined voltage value; and
- a time setting circuit for setting a pulse width of a write or erase voltage pulse for a memory cell, after the voltage detection circuit detects that the output voltage from the booster circuit has reaches the predetermined voltage value.

12. A semiconductor memory according to claim 10, further comprising:
- a first switch circuit having an end which is connected to an output terminal the second booster cell section;
- a second switch circuit connected to a connection point between the output terminal of the second booster cell section and the first switch circuit; and
- a third booster cell section having one end connected to the first switch circuit, in which a plurality of booster cells are connected in series.

13. A semiconductor memory according to claim 12, further comprising:
- a voltage detection circuit for detecting that the output voltage from the booster circuit reaches a predetermined voltage value; and
- a time setting circuit for setting a pulse width of a write or erase voltage pulse for a memory cell, after the voltage detection circuit detects that the output voltage from the booster circuit has reaches the predetermined voltage value.

14. A semiconductor memory comprising:
- a booster circuit;
- a memory cell array on which writing, reading and erasing of data are carried out in accordance with the output voltage from the booster circuit;
- a voltage detection circuit for detecting that the output voltage from the booster circuit reaches a predetermined voltage value; and
- a time setting circuit for setting a pulse width of a write or erase voltage pulse for a memory cell, after the voltage detection circuit detects that the output voltage from the booster circuit has reached the predetermined voltage value.

* * * * *